United States Patent
Glaise et al.

(10) Patent No.: US 7,103,822 B2
(45) Date of Patent: Sep. 5, 2006

(54) METHOD AND APPARATUS FOR COMPUTING 'N-BIT AT A TIME' CRC'S OF DATA FRAMES OF LENGTHS NOT MULTIPLE OF N

(75) Inventors: Rene Glaise, Nice (FR); Fabrice Verplanken, La Gaude (FR)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 10/248,010

(22) Filed: Dec. 10, 2002

(65) Prior Publication Data

US 2003/0120992 A1    Jun. 26, 2003

(30) Foreign Application Priority Data

Dec. 21, 2001    (EP) .................. 01480145

(51) Int. Cl.
*H03M 13/00*    (2006.01)
(52) U.S. Cl. ...................... 714/758; 714/776
(58) Field of Classification Search ............... 714/755, 714/776, 758
See application file for complete search history.

(56) References Cited

U.S. PATENT DOCUMENTS

| | | | | |
|---|---|---|---|---|
| 5,121,396 A | * | 6/1992 | Irvin et al. ............... | 714/807 |
| 5,132,975 A | * | 7/1992 | Avaneas ................... | 714/757 |
| 5,689,518 A | * | 11/1997 | Galand et al. ............ | 714/752 |
| 5,935,268 A | * | 8/1999 | Weaver .................... | 714/758 |
| 5,951,707 A | * | 9/1999 | Christensen et al. ...... | 714/752 |
| 6,226,771 B1 | * | 5/2001 | Hilla et al. ............... | 714/758 |
| 6,327,691 B1 | * | 12/2001 | Huang ...................... | 714/781 |
| 6,519,737 B1 | * | 2/2003 | Derby ...................... | 714/781 |
| 6,519,738 B1 | * | 2/2003 | Derby ...................... | 714/781 |
| 6,684,363 B1 | * | 1/2004 | Cassiday et al. .......... | 714/776 |
| 6,763,495 B1 | * | 7/2004 | Suzuki et al. ............. | 714/781 |

* cited by examiner

*Primary Examiner*—Albert Decady
*Assistant Examiner*—Mujtaba K. Chaudry
(74) *Attorney, Agent, or Firm*—W. Riyon Harding; Anthony J. Canale

(57) ABSTRACT

The present invention discloses CRC checking 'N-bit at a time' of data frames of lengths not necessarily in a multiple of the N-bit. While receiving the data frame, the data frame length is extracted from the protocol header and a misalignment is computed versus the 'N-bit at a time' value. Simultaneously, CRC is computed on each received N-bit of the data frame and an FCS register is updated. At each cycle, a checking is performed to know whether the data frame length has been extracted from the protocol header. While the data frame length is not yet known and more bits are left to process, the data frame is continued to be received and computed 'N-bit at a time'. When the data frame length is known and no more bits are to be processed, the current value of the FCS register is compared to a pre-stored vector corresponding to the misalignment. If a match occurs, checking of the data frame passes and the data frame is accepted. If a match does not occur, checking of the data frame fails and the data frame may be rejected. Therefore, the present invention is capable of computing CRC of a data frame 'N-bit at a time' while the data frame length is not yet known.

4 Claims, 6 Drawing Sheets

PRIOR ART

PRIOR ART

| 600 | d | Expected result if frame is not altered |
|---|---|---|
| | 0 | 11111111111111111111111111111111 |
| | 1 | 01001110000010001011111110110100 |
| | 2 | 00000000101101110110010001111101 |
| | 3 | 10110111011001000111110100000000 |
| | 4 | 11000111000001001101110101111011 |
| | 5 | 01000111000100001011101110011100 |
| | 6 | 00111010011110101011110001110010 |
| | 7 | 10000001000001001100100101000110 |

| d | Vectors to multiply backward in GF of CRC-32 | |
|---|---|---|
| 0 | 00000000000000000000000000000001 | $= \alpha^0$ |
| 1 | 10101001110100111110011010100110 | $= \alpha^{-8}$ |
| 2 | 00011010110010100100100011101011 | $= \alpha^{-16}$ |
| 3 | 10000111011011011000000111111000 | $= \alpha^{-24}$ |
| 4 | 11001011111100011010110011011010 | $= \alpha^{-32}$ |
| 5 | 11111101011100111000010011010111 | $= \alpha^{-40}$ |
| 6 | 10100011000000010001111111110100 | $= \alpha^{-48}$ |
| 7 | 00111100010000100011111111101001 | $= \alpha^{-56}$ |

```
62-------------------------------------------------------------------0
111.111.......1...1.11..1......1.........................1 0
..11..1......11..111.1.11.....11................................1. |
1...1.1......111.11...1111...111...............................1.. |
..1.1......111.11...1111...111..................................1... |
11...11...111..1..11..1.1.111.1.....................................|
.11...1..111.....1...1..11111.11................................1....|
11...1..111.....1..1..11111.11..................................1......|
.11..11111....11....1.11.1.11.1................................1.......|
..1...11....1.....111.1...11.11.................................1.......|
.1...11....1.....111.1...11.11................................1........|
.11.1......1..1.11...1...1.11.1...............................1.........|
..11111...1..1111.1..1....11.11..............................1..........|
1..1..1..1..11.1.11...1..111.111.............................1............|
..1..1..1..11.1.11...1...111.111............................1.............|
.1..1..1..11.1.11...1...111.111.............................1..............|
1..1..1..11.1.11...1...111.111..............................1...............|
11..1.11.1.1...11...1..11...1................................1...............|
1..1.1.11.1.1...11....1..11...1...........................1.................|
..1.1.11.1.1...11...1..11...1..............................1.................|
.1.1.11.1.1...11...1..11...1..............................1..................|
1.1.11.1.1...11...1..11..1................................1...................|
.1.11.1.1...11...1..11...1................................1....................|
.1.11.11...11.1.1.11.1.......1....1.........................|
.1.11.....11.111.1...1..1.....11..........................1.....|
1.11.....11.111.1...1..1.....11..........................1......|
.11.....11.111.1...1..1.....11...........................1.......|
..1.11111.111........1....1.11..1......1.................|
.1.11111.111.........1...1.11..1.....1..................|
1.11111.111..........1...1.11...1.....1.................|
.11111.111.........1...1.11..1.....1....................|
11111.111........1...1.11..1.....1.......................|
1111.111........1...1.11..1.....1.......................31
```

METHOD AND APPARATUS FOR COMPUTING 'N-BIT AT A TIME' CRC'S OF DATA FRAMES OF LENGTHS NOT MULTIPLE OF N

BACKGROUND OF THE INVENTION

Field of the Invention

The present invention relates generally to the computation of Cyclic Redundancy Checks (CRC's), and more particularly applies to a method and apparatus where computation is performed 'N-bit at a time' and starts while data frame lengths, not necessarily a multiple of N, are not yet known.

BACKGROUND OF THE INVENTION

Frames of data transmitted over telecommunications lines are generally protected with a CRC code. As shown in FIG. 1, frame or message 110 is encoded by transmitting side 100 which adds redundancy under the form of Field Check Sequence (FCS) 105, at the end of frame or message 110, to be transmitted through network 120. Receiving side 130 must then perform a check to accept the frame as valid before any further processing. Protocol frames are generally of variable lengths. This means that there is field 140 somewhere in the protocol header 160 that must be interpreted by the receiver so that the length of current frame 150 is known and the end of frame, and the FCS field, can unambiguously be located in order to be able to perform the checking properly.

CRC checking has long been done '1-bit at a time' with the help of a device referred to as a Linear Feedback Shift Register (LFSR), an example of which is shown in FIG. 2. LFSR is also a convenient means by which the protocols specify how frame encoding and checking must be carried out so as a data frame is encoded by the transmitter and recognized as valid by the receiver according to the protocol specifications. FIG. 2 illustrates an LFSR corresponding to the CRC-32 used by many protocols such as the Adaptation Layer 5 (AAL5) of Asynchronous Transfer Mode (ATM) or Ethernet. This particular LFSR allows the encoding and checking of frames '1-bit at a time' per the following generator polynomial:

$$G(X)=X^{32}+X^{26}+X^{23}+X^{22}+X^{16}+X^{12}+X^{11}+X^{10}+X^8+X^7+X^5+X^4+X^2+X^1+1,$$

which is the degree 32 generator used by the above protocols for protecting their data transmissions.

When the performance of telecommunications lines used to access a network, such as network 120 shown in FIG. 1, dramatically improves, the simple device of FIG. 2 is no longer capable of handling the increased transmission line speeds. Numerous methods and devices have thus been proposed, and used, to process more bits together. Especially, methods to compute CRC '8-bit (i.e., a byte) at a time' have been devised in order to speed up computation accordingly. One of the earliest reference on a method for computing 8-bit at a time is a paper by A.Perez, "Byte-wise CRC calculations", published in IEEE Micro, June 1983. Because frame lengths are often, if not always, comprised of an integer number of bytes this did not create any difficulty. Either a logic device is fast enough to compute and it is possible to wait until the length of a current frame is extracted before actually starting the computation, or since it is possible to assume that frame lengths are made of an integer number of bytes, computation can start as soon as the first Most Significant Byte (MSB) is received. Then, when length is later extracted from the frame header, computation can be stopped on time to match the actual frame length, on a byte or 8-bit boundary.

However, because telecommunication line performance has continued its dramatic growth, logic designers have now to deal with line speeds in the 10–40 Gbps (Gigabits per second) range. This corresponds, for the lower value, to e.g., an OC-192 Optical carrier of the Synchronous Optical NETwork (SONET) hierarchy, a North American standard, or to the 10 Gbps version of the Ethernet standard. Because the performance of Application Specific Integrated Circuits (ASIC's) or Field Programmable Logic Arrays (FPGA's) that are commonly used to implement the corresponding logic have not seen, by far, their performance increased accordingly, designers have to consider the use of logic devices in which even more bits or bytes have to be processed together, at each device cycle, in an attempt to reach the necessary level of performance. However, if protocol data frames are indeed an integer number of bytes they are not necessarily a multiple of 4 or 8 bytes, which is now the typical number of bytes that must be processed together, to match such line speeds with a cost-performance technology like Complementary Metal Oxide Semiconductor (CMOS) thus avoiding the use of expensive higher performance technologies like the ones based on Gallium Arsenide (GaAs) that would otherwise be required. An example of the problem encountered is shown in FIG. 3 where a 19-byte frame 300 protected e.g., with the 4-byte CRC-32 discussed in FIG. 2, must be handled, for performance reasons, by a device 310 capable of computing 8-byte at a time storing its intermediate results in a 4-byte FCS register 330. Then, computation cannot start until the actual frame length is known because frames are always transmitted MSB first. Hence, if starting right away, as shown in FIG. 3, the result would be wrong because the computation device must be aligned on the last received bit or byte so as the FCS 320 is indeed the true least significant portion of the frame which is clearly not the case here.

In practice, this requires that alignment (i.e., a left justification) be done prior to the beginning of the computation by padding enough null bytes 400 in front of the received frame, as shown in FIG. 4, so that the last cycle of the computation matches exactly with the FCS field 410. In other words, the received frames must be padded with enough front null bytes so as they become a multiple of the number of bits or bytes i.e., 8 bytes in this example, handled at each cycle of the CRC computing device. Like with ordinary numbers, padding 0's in front does not affect the end result of a division which is basically what CRC is doing on the binary string of bits which forms the data frame.

Again, this implies that lengths of frames be known when starting. This goes against the need of having to begin the computation as quickly as possible in order to cope with line speed increases while ASIC and FPGA technologies in use do not enjoy an equivalent improvement of their performances.

BRIEF SUMMARY OF THE INVENTION

Thus, it is an object of the present invention to provide a method and an apparatus which does not assume that frame lengths are known prior to starting the computation of CRC's n-bit or n-byte at a time.

Another object of the present invention is to not require that data frames be left padded, so as their lengths become a multiple of n-bit or n-byte, to be able to perform the checking of the received data frames.

Another object of the present invention is to restore the result of the CRC computation as if it had been performed with the necessary left padding.

The present invention dislcoses a CRC checking 'N-bit at a time' of data frames having lengths not necessarily a multiple of the N-bit. While receiving the data frame, the length of the data frame is extracted from the protocol header. Then, a misalignment is computed for the received data frame versus the 'N-bit at a time' value. Simultaneously, having received N-bit of the data frame, CRC is computed on the received N-bit and an FCS register is updated. A check is performed to determine whether the length has been extracted from the protocol header. If the length of the data frame is not yet known, the data frame continues to be received and 'N-bit at a time' continues to be computed. Once the length of the data frame is known, the extracted length is compared with the current number of received N-bit of the data frame thus, a checking is performed to determine whether more bits are to be processed or not. If more bits are left to process, the data frame continues to be received 'N-bit at a time' continues to be computed. If no more bits are left to process, the current value of the FCS register is compared to a pre-stored vector corresponding to the misalignment. If there is a match, checking of the data frame passes and the data frame is accepted. If there is not a match, checking fails and the data frame is rejected.

A method and an apparatus are also disclosed for restoring the value of the FCS register as if computation had actually stopped on the data frame boundary.

Therefore, the invention manages to start checking CRC of a data frame 'N-bit at a time' while the data frame length is not yet known.

Further objects, features and advantages of the present invention will become apparent to those skilled in the art upon examination of the following description in reference to the accompanying drawings. It is intended that any additional advantages be incorporated herein.

BRIEF DESCRIPTION OF THE SEVERAL VIEWS OF THE DRAWINGS

FIG. 9 illustrates a multiplier to restore FCS register value.

DETAILED DESCRIPTION OF THE INVENTION

Figure 3:
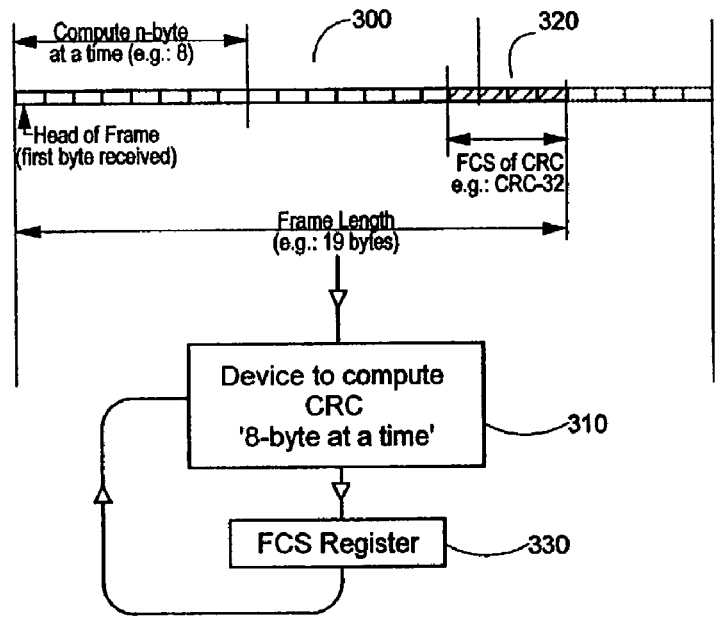
FIG. 3 illustrates a problem encountered when computing CRC's 'N-bit at a time'.
Figure 4:
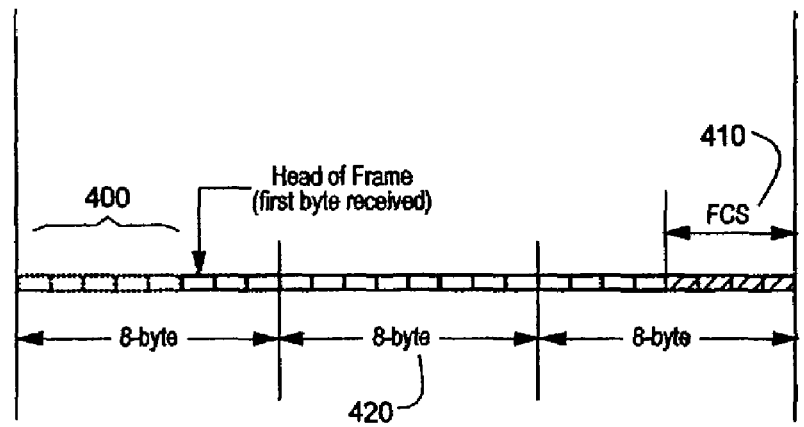
FIG. 4 shows how a data frame is left padded to obtain the correct result.
Figure 5:
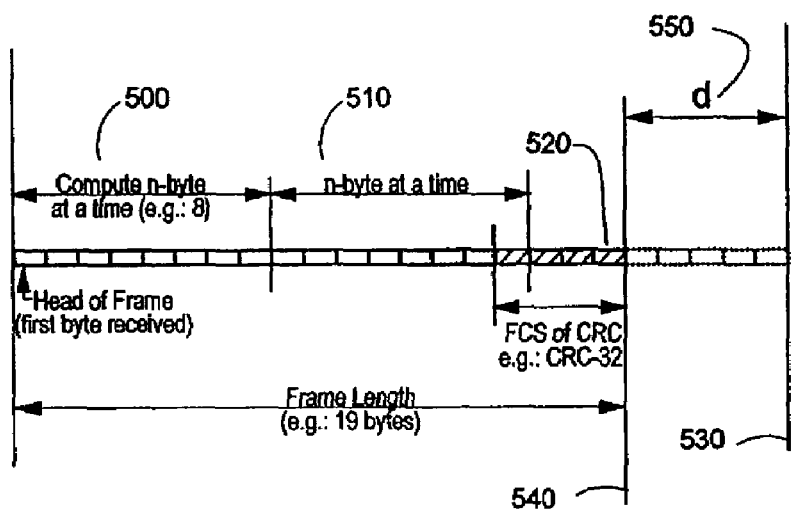
FIG. 5 illustrates the principle of the present invention which does not require left padding thus, does not assume that frame length be known to start checking.

According to the present invention, it is possible to start computing CRC as soon as enough bits and bytes 500 have been accumulated to match the 8-byte computing device assumed in the example of FIG. 3, i.e., without having to first make any assumption on the length of the data frame to check, as shown in FIG. 5. Computation continues in multiples of 8-bytes 510 until last byte 520 is received. It is known to stop at that time since the length of the data frame is assumed to have been extracted from the header, after computation has started however, and before the last byte of the data frame is received. Nevertheless, the computation has generally gone too far. Because computing is performed on an 8-byte boundary, in this particular example used to illustrate the present invention, the end result corresponds to 24 bytes received 530 while only 19 bytes (540) should have been processed. This may not be a real problem in some specific applications though. If the expected result of the checking (i.e., frame has not been altered) is an all zero or null vector, then further dividing of 0, like with ordinary numbers, does not change the final result. However, most standards (if not all) that deal with CRC, manage to include a provision to prevent an all zero frame from passing checking for the obvious reason that a failing device could have generated it and this must be detectable. To avoid this from happening, standards generally specify that FCS are transmitted inverted after having been calculated over a string of data bits. Hence, the result of the checking, on the receiving side, is rather an all 1's vector which corresponds to the inversion of the FCS before transmission by the sending device.

Figure 1:
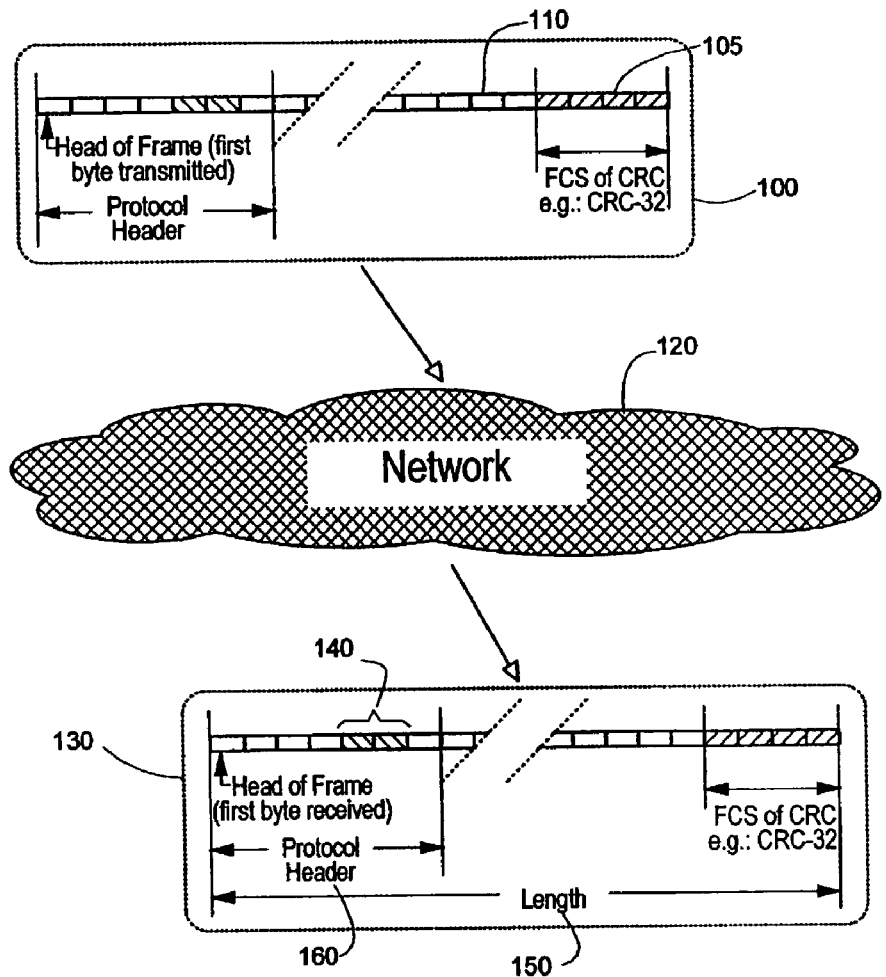
FIG. 1 illustrates a data frame protected by a CRC and exchanged from a transmitting side to a receiving side through a network.
Figure 2:
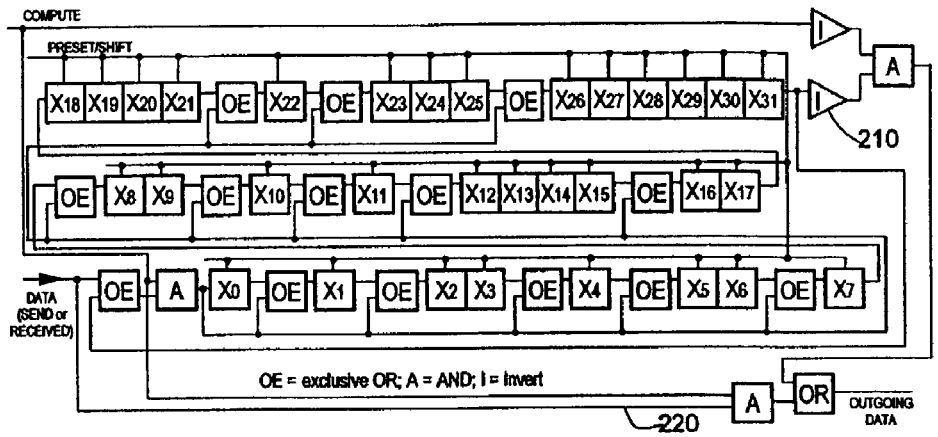
FIG. 2 shows an LFSR aimed at computing CRC's.

It is worth noting here that the LFSR shown in FIG. 2 reflects this. This is the inverted result (210), present in the SR at the end of the computation, which is sent 'one-bit at a time', most significant bit first, as the FCS, while data bits are transmitted without inversion (220) while computation continues.

Therefore, the expected result of a frame checking is not generally an all zero vector. It is thus further divided by the device in charge of computing 'n-byte at a time', of a value corresponding to the extra displacement d 550, incurred because the frame could not be left justified at the start of the computation.

Figures 6, 7:
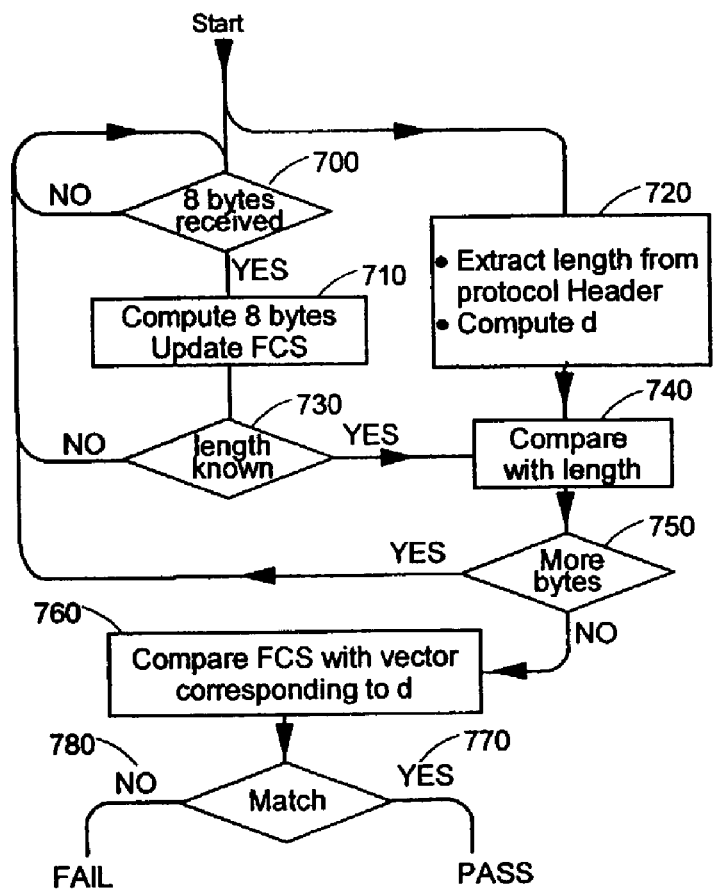
FIG. 6 is an example of the set of vectors that must be stored to allow CRC checking according to the present invention.
FIG. 7 is a flow chart illustrating the steps of checking a data frame according to the present invention.

To accommodate this, it is assumed that enough patterns are stored to take care of all values that d can take in a particular application. In the example chosen to illustrate the present invention, namely, the CR-32 of ATM and Ethernet, computed '8-byte at a time', only 8 patterns must be stored since frames are always byte aligned. The eight values to be stored are shown in FIG. 6 as a function of d 600, expressed in number of bytes. These patterns correspond to the extra division supported by the all 1's pattern which is the normal result of the checking in this case, i.e. when d=0, when the frame is aligned because it is a multiple of the n-bit or n-byte value computation that is performed at each cycle. The patterns shown here implicitly assume that 0's are automatically padded at the right of the frame when the length is not an exact multiple of the 'n-byte at a time' calculation. Other patterns would have to be calculated if the right padding were different. This would not however change the way frame checking is conducted which is better described with reference to the flow chart shown in FIG. 7.

FIG. 7 shows the steps of the method according to the present invention to check CRC. Calculation can actually start as soon as enough bits or bytes have been received in step 700 to feed the device in charge of performing calculation 'n-byte at a time'. Thus, n-byte of the incoming data are processed at each cycle in step 710. In parallel, the length of the data frame is extracted from the frame header of the received data so that the value of the misalignment d can be determined versus the number of bytes that are processed at each cycle in step 720. When the length is known in step 730, the number of bytes that have been processed (in increments of n-bytes) are compared to the length of the frame in step 740. If the number of bytes that have been processed is less than the length of the frame, more bytes have to be processed as determined in step 750, then the process resumes at step 700. If the number of bytes that have been processed is equal to or larger than the length of the frame, the current value of the calculated FCS must be compared in step 760 to the one of the stored vector corresponding to the value of d determined at step 720. An example of such vectors are shown in FIG. 6. If matching occurs, i.e. checking of the frame passes, it must be considered that the frame has not been altered en route and can be further processed via step 770. If matching does not occur, i.e. checking of the frame fails, the frame must be handled according to the error recovery procedures in effect in the receiver via step 780. Typically, the failed frame is discarded.

Although the examples used to describe the invention are referring to a method and an apparatus where processing is done 'n-byte at a time', it will be obvious to the one skilled in the art that the present invention applies as well to methods and systems where 'n-bit at a time' would be processed. Indeed, 'n-bit' can take any value including the practical cases where CRC's are computed in a multiple of bytes or octets, that is, in multiples of '8-bit'. More specifically, the invention is illustrated with the case where 'n-byte' is actually '8-byte' and the CRC is the common (4-byte) CRC-32 of many protocols. Any value of n and any CRC could be considered as well and the present invention would still apply.

Figures 8, 9A:
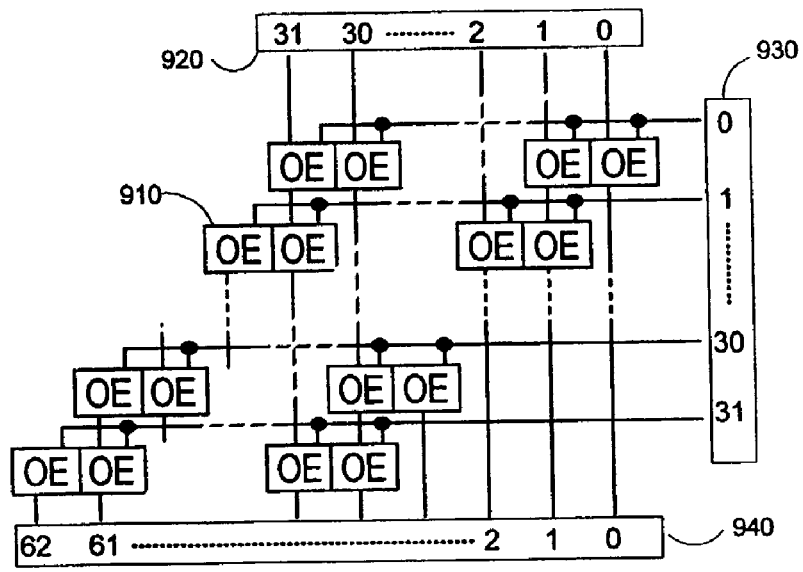
FIG. 8 is an example of the set of vectors that must be stored to allow the restoration of the FCS register to the right value i.e., as if computation had actually stopped on frame boundary.

FIG. 8 illustrates the fact that, up to this point, it was implicitly assumed that the receiver side is only interested in checking the integrity of the incoming frame (so that it can be safely further processed). This is most often the only purpose of adding a CRC to a data frame. However, some applications may want go further and require performing corrections of errors or analyzing the result of the checking. It is clear that the previous method described with reference to FIG. 7 is limited to the first common case. Although the method manages to determine if the result of the checking is good or not, it remains that this result is not the one that would have been obtained if computing had actually stopped on the right boundary of the frame.

Hence, to obtain the right result of the checking, often referred to as the syndrome in the literature on CRC and Error Correction Code (ECC), it is necessary to move backward and restore the value as if computation has indeed stopped on the good boundary. This can be achieved simply by multiplying the result of the checking by a vector corresponding to a backward displacement of d 550, as shown in FIG. 5, in the Galois Field or the Multiplicative Group that can be generated with the generator polynomial G(X) of the CRC in use. This must be done in an algebra modulo 2, modulo G(X) an elementary implementation of the circuitry needed to do so being the LFSR of FIG. 2.

FIG. 8 shows, as an example, the 8 vectors that must be used to multiply 'backward' and obtain the result of the checking as if computation could have stopped on the right boundary. These vectors are for the specific example used for illustrating the invention and are 8 vectors among the 4,294,967,295 ($2^{32}-1$) vectors of the Galois Field that can be generated with the CRC-32 polynomial:

$$G(X)=X^{32}+X^{26}+X^{23}+X^{22}+X^{16}+X^{12}+X^{11}+X^{10}+X^{8}+X^{7}+X^{5}+X^{4}+X^{2}+X^{1}+1.$$

There are numerous practical solutions to multiplying two 32-bit vectors modulo 2, modulo G(X) i.e., the vector result of the checking, as obtained in FIG. 7 by the backward multiplying vector of FIG. 8, so as to get the unbiased result. This can be carried out in many ways known in the art.

As an example, one can refer to 'Error Correcting Codes', Peterson and Weldon, Second Edition, the MIT Press, Cambridge, Mass., USA, 1972 and more particularly to chapter 7.3 'Computation in Polynomial Algebras and Galois Fields'. The circuits proposed in this reference are of the type of the LFSR of FIG. 2. They are, by design ('1-bit at a time'), limited in performance.

Figures 9B, 10:
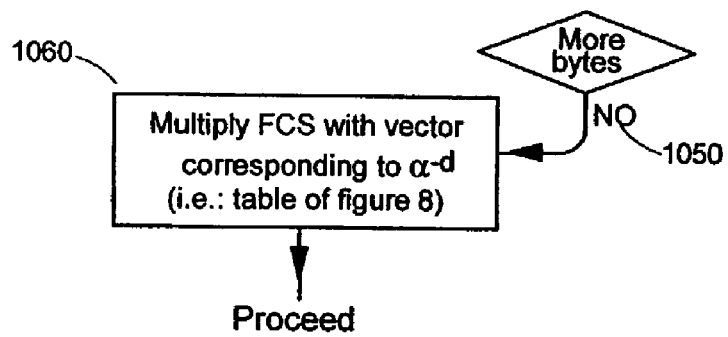
FIG. 10 is a flow chart illustrating the step of allowing the restoration of the FCS register.

A full combinatorial circuit for the example of the CRC-32 is shown in FIGS. 9A and 9B as a much faster way of performing the backward multiplication that allow move back to the right syndrome. FIG. 9A, shows an array of OE's or 2-way Exclusive OR operators 910 in this example, which performs the multiplication modulo 2 of two vectors 920, 930 so as the result is 63 bit vector 940. This intermediate result must be reduced, modulo G(X) thus, to 32-bit vector 950 through another matrix of OE's 960 shown in FIG. 9B. For the sake of clarity, this matrix shows a 1 where, on a per row basis, an input to a wide OE function must be connected to get the corresponding output bit. For example bit 0 of final result 950 is the OE of intermediate result bits 62, 61, 60, 58, 57, 56, 48, 44, 42, 41, 38, 32 and 0.

Hence, if syndrome must be restored, the method of FIG. 7 has to be changed. Step 760 is replaced by step 1060 of FIG. 10 after it has been determined that all bytes of the frame have been received in step 1050. Thus, step 1060 performs the backward multiplication as discussed in FIGS. 9A and 9B or through any method known in the art. At this point the syndrome is restored as if computation had been done with standard methods and one may proceed as usual. For example syndrome may be analyzed so as a correction of the received frame can be done if it was indeed the purpose of restoring the syndrome.

It is worth noting that the method illustrated in FIG. 10 can be used as well to compute the FCS on the transmitting side. Although it was assumed, up to this point, that the length of the frame is not known to the receiver when starting the checking, if the same situation is encountered on the transmitting side, then the method illustrated in FIG. 10 (i.e., method shown in FIG. 7 with the modified step of FIG. 10) can be used to determine the correct FCS to transmit after the backward multiplication is done at step 1060.

Although illustrative embodiments and its advantages have been described in detail hereinabove, they have been described by way of example and not by way of limitation. Various changes, substitutions and alterations can be made in the illustrative embodiments withough departing from the breadth, scope and spirit of the present invention.

What is claimed is:

1. A method for allowing a Cyclic Redundancy Check (CRC) checking 'N-bit at a time' of a data frame having a length not necessarily a multiple of said N-bit wherein said N-bit is a predetermined number of bits and the length of the data frame is not initially known, said method comprising the steps of:

(a) receiving N-bit of said data frame;
  (i) determining CRC on said received N-bit;
  (ii) updating a Field Check Sequence (FCS) register;
  (iii) determining if said length of said data frame is known, wherein when said length of said data frame is not yet known, repeating steps (a)(i)–(iii) 'N-bit at a time', and (b) simultaneously with step (a) receiving said data frame;
  (i) extracting a length from a protocol header of said data frame;
  (ii) determining a misalignment d between said length of said data frame and an N-bit boundary of said data frame, wherein said N-bit boundary is the least whole number of N-bits required to encompass said length of said data frame; and when said length of said data frame is known, comparing said extracted length of said data frame to a number of N-bits which have been processed for said data frame and determining whether more bits are to be processed, further wherein, when more bits are left to process, repeating steps (a)(i)–(iii) 'N-bit at a time', and when no more bits are left to process, comparing a current value of said FCS register to a pre-stored vector corresponding to said misalignment d, wherein when a match occurs checking of said data frame passes and said data frame is accepted, and when a match does not occur checking of said data frame fails and said data frame is rejected.

2. The method according to claim 1 wherein said N-bit comprises an integer number of 8-bit bytes (N-byte).

3. The method according to claim 1 wherein said step of comparing a current value of said FCS register to a pre-stored vector corresponding to said misalignment d is replaced by the step of:

backward multiplying in algebra modulo 2, modulo G(X), said FCS register value by a pre-stored vector corresponding to said misalignment d;

wherein said FCS register value is restored as it computation had stopped on a frame boundary.

4. The method according to claim 3 wherein said method is used to compute said FCS on a transmitting side.

* * * * *